(12) United States Patent
Chen et al.

(10) Patent No.: US 12,339,632 B2
(45) Date of Patent: Jun. 24, 2025

(54) TRAINING METHOD FOR SEMICONDUCTOR PROCESS PREDICTION MODEL, SEMICONDUCTOR PROCESS PREDICTION DEVICE, AND SEMICONDUCTOR PROCESS PREDICTION METHOD

(71) Applicant: UNITED MICROELECTRONICS CORP., Hsinchu (TW)

(72) Inventors: Chia-Wei Chen, Chiayi (TW);
Ching-Pei Lin, Hsinchu County (TW);
Chung-Yi Chiu, Tainan (TW);
Te-Hsuan Chen, Tainan (TW);
Ming-Wei Chen, Tainan (TW);
Hsiao-Ying Yang, Tainan (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 379 days.

(21) Appl. No.: 17/695,255

(22) Filed: Mar. 15, 2022

(65) Prior Publication Data

US 2023/0236553 A1     Jul. 27, 2023

(30) Foreign Application Priority Data

Jan. 21, 2022   (CN) .......................... 202210070302.0

(51) Int. Cl.
*G05B 13/04*     (2006.01)
*H01L 21/66*     (2006.01)
(52) U.S. Cl.
CPC ............ *G05B 13/048* (2013.01); *H01L 22/12* (2013.01); *H01L 22/14* (2013.01)

(58) Field of Classification Search
CPC ....... G05B 13/048; H01L 22/12; H01L 22/14; H01L 22/20; Y02P 90/30; G06Q 10/04; G06Q 10/0633; G06Q 50/04; G06N 20/00
See application file for complete search history.

(56) References Cited

U.S. PATENT DOCUMENTS 6,610,550 B1 *   8/2003   Pasadyn ................. H01L 22/20
                                                          438/15
7,494,893 B1 *   2/2009   Inani ................. G05B 19/41875
                                                         438/424

(Continued)

OTHER PUBLICATIONS

Kang, A. et al., Incorporating Virtual Metrology Into Failure Prediction. IEEE Transactions on Semiconductor Manufacturing, vol. 32, No. 4, pp. 553-558, Nov. 2019, doi: 10.1109/TSM.2019. 2932377, [retrieved on May 5, 2025]. Retrieved from the Internet (Year: 2019).*

*Primary Examiner* — Kamini S Shah
*Assistant Examiner* — Mohammed Shafayet
(74) *Attorney, Agent, or Firm* — WPAT, PC (57) ABSTRACT

A training method of a semiconductor process prediction model, a semiconductor process prediction device, and a semiconductor process prediction method are provided. The training method of the semiconductor process prediction model includes the following steps. The semiconductor process was performed on several samples. A plurality of process data of the samples are obtained. A plurality of electrical measurement data of the samples are obtained. Some of the samples having physical defects are filtered out according to the process data. The semiconductor process prediction model is trained according to the process data and the electrical measurement data of the filtered samples.

13 Claims, 7 Drawing Sheets

(56) References Cited

U.S. PATENT DOCUMENTS

| | | | |
|---|---|---|---|
| 2006/0184264 A1* | 8/2006 | Willis | G05B 19/4184 |
| | | | 700/110 |
| 2009/0299679 A1* | 12/2009 | Desineni | G01R 31/2894 |
| | | | 702/119 |
| 2017/0109646 A1* | 4/2017 | David | G03F 7/70625 |
| 2019/0286983 A1* | 9/2019 | Jung | G06N 3/04 |
| 2020/0020092 A1* | 1/2020 | Fang | G06F 18/24 |
| 2020/0110390 A1* | 4/2020 | Banna | G05B 19/41875 |

\* cited by examiner

TRAINING METHOD FOR SEMICONDUCTOR PROCESS PREDICTION MODEL, SEMICONDUCTOR PROCESS PREDICTION DEVICE, AND SEMICONDUCTOR PROCESS PREDICTION METHOD

This application claims the benefit of People's Republic of China application Serial No. 202210070302.0, filed Jan. 21, 2022, the disclosure of which is incorporated by reference herein in its entirety.

TECHNICAL FIELD

The disclosure relates in general to a training method for a process prediction model, a process prediction device, and a process prediction method, and more particularly to a training method for a semiconductor process prediction model, a semiconductor process prediction device, and a semiconductor process prediction method.

BACKGROUND

With the high development of semiconductor technology, various complex semiconductor components are constantly being introduced. In the semiconductor manufacturing process, a wafer needs to go through thousands of processes to produce the final product. Therefore, researchers need to perform various tests on semi-finished products. The electrical measurement data is a very important test, which can test the electrical parameters of NMOS, PMOS, resistor, contact resistor or internal connection on the wafer.

The electrical measurement data can be used to determine whether there is an abnormality, and can also be used to estimate the yield of the final product. The electrical measurement data has a certain effect on the improvement of yield. However, if abnormalities can be detected earlier in the process, it will be more helpful to improve the yield. In order to detect anomalies as early as possible, researchers expect that the electrical measurement data can also be predicted.

SUMMARY

The disclosure is directed to a training method for a semiconductor process prediction model, a semiconductor process prediction device, and a semiconductor process prediction method. During the training process, the samples having physical defects are not considered to improve the accuracy of the semiconductor process prediction model. After improving the accuracy of the semiconductor process prediction model, the electrical measurement data can be accurately predicted for the wafers without physical defects, and the wafers with physical defects can also be found to be abnormal, which is very helpful to improve the yield.

According to one embodiment, a training method for a semiconductor process prediction model. The training method includes the following steps. A semiconductor process is performed on a plurality of samples. A plurality of process data of the samples are obtained. A plurality of electrical measurement data of the samples are obtained. Some of the samples having at least one physical defect are filtered out according to the process data. The semiconductor process prediction model is trained according to the process data and the electrical measurement data of the samples after filtering.

According to another embodiment, a semiconductor process prediction device is provided. The semiconductor process prediction device includes a process data receiving unit, an electrical data receiving unit, a filtering unit and a semiconductor process prediction model. The process data receiving unit is configured to obtain a plurality of process data of a plurality of samples which are performed a semiconductor process. The electrical data receiving unit is configured to obtain a plurality of electrical measurement data of the samples. The filtering unit is configured to filter out some of the samples having at least one physical defect according to the process data. The semiconductor process prediction model is trained according to the process data and the electrical measurement data of the samples after filtering.

According to an alternative embodiment, a prediction method of a semiconductor process is provided. The prediction method includes the following steps. A semiconductor process is performed on at least one wafer. A plurality of process data of the wafer is obtained. Whether the wafer has at least one physical defect is determined according to the process data. If the wafer has the physical defect, a prediction is terminated. If the wafer does not have the physical defect, the prediction is performed, via a semiconductor process prediction model according to the process data, to predict an electrical measurement data.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 1:
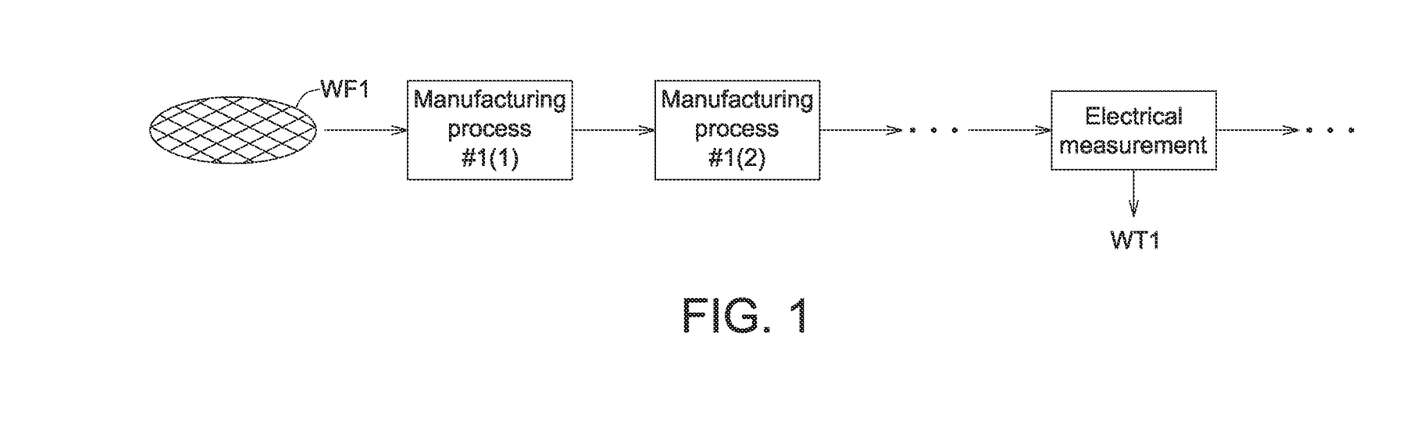
FIG. 1 shows a schematic diagram of a semiconductor process according to an embodiment.

Please refer to FIG. 1, which shows a schematic diagram of a semiconductor process according to an embodiment. In the semiconductor manufacturing process, a wafer WF1 needs to go through thousands of processes to produce the final product. Researchers need to perform various tests on semi-finished products. After some circuits and component structures have built through several processes, an electrical measurement can be performed. The electrical measurement can test the electrical parameters of NMOS, PMOS, resistor, contact resistor or internal connection on the wafer WF1. Electrical measurement data WT1 can be used to determine whether there is any abnormality in these processes, and can also be used to estimate the yield of the final product. After confirming the electrical measurement data WT1, the wafer WF1 may need to continue with other stages of the process.

Then, after several processes are completed, the electrical measurement is performed again.

In order to detect abnormality as early as possible, a semiconductor process prediction model is provided in the present embodiment. Before the process at this stage is completed (that is, before the electrical measurement is performed), the semiconductor process prediction model can predict the electrical measurement data to detect abnormalities in advance. Before the process at this stage is completed (that is, before the electrical measurement is performed), the semiconductor process prediction model can predict the electrical measurement data to detect abnormalities in advance.

Figure 2:
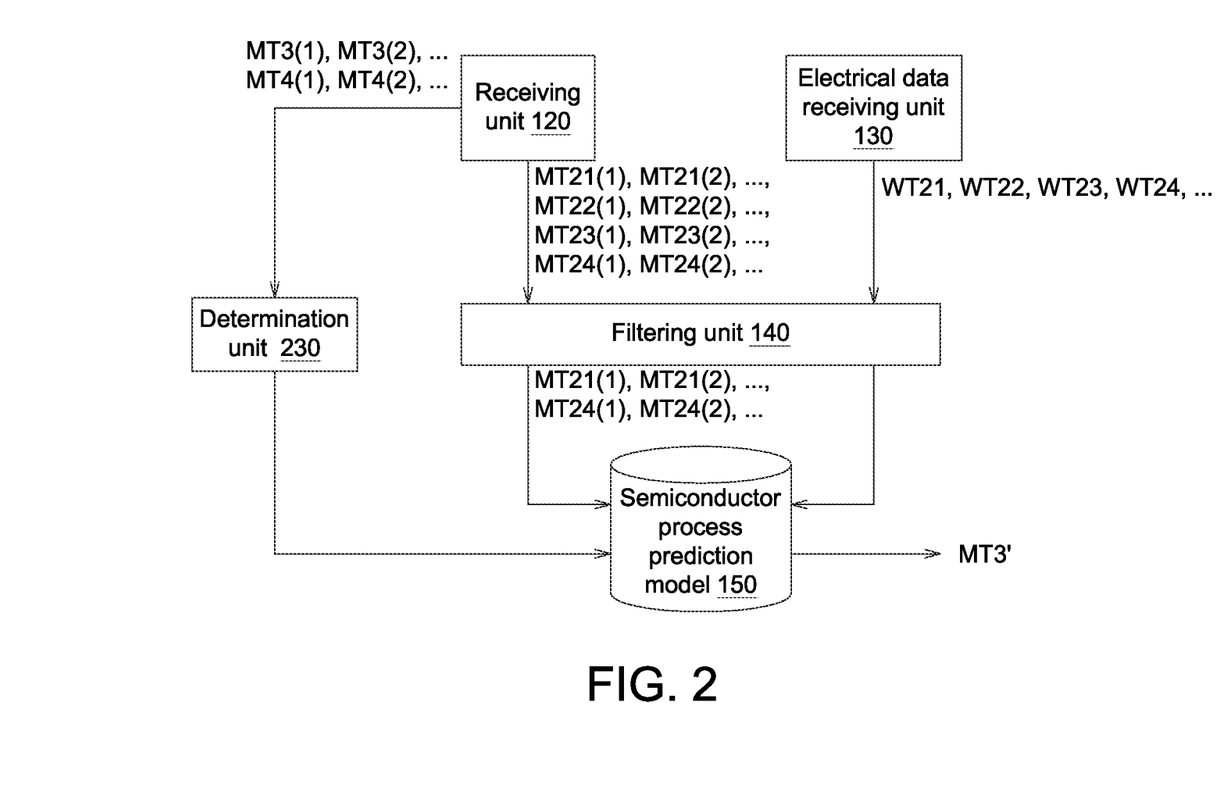
FIG. 2 shows a block diagram of a semiconductor process prediction device 1000 according to an embodiment.

Please refer to FIG. 2, which shows a block diagram of a semiconductor process prediction device 1000 according to an embodiment. The semiconductor process prediction device 1000 includes a process data receiving unit 120, an electrical data receiving unit 130, a filtering unit 140, a semiconductor process prediction model 150 and a determination unit 230. The functions of the components are outlined below. The process data receiving unit 120 and the electrical data receiving unit 130 are used to obtain data. The process data receiving unit 120 and the electrical data receiving unit 130 are, for example, wired network transmission modules, wireless network transmission modules or LTE transmission modules. The filtering unit 140 is used for data filtering. The semiconductor process prediction model 150 is a machine learning model. The determination unit 230 is used for data judgment. The filtering unit 140, the semiconductor process prediction model 150 and/or the determination unit 230 are, for example, a circuit, a chip, a circuit board, a code, a computer program product, or a recording medium storing the code.

The semiconductor process prediction model 150 can predict the electrical measurement data. During performing the training method of the semiconductor process prediction model 150 in this embodiment, some of the samples having physical defects will be filtered out to ensure that non-process factors will not affect the accuracy of the prediction results. Moreover, during performing the execution method of the semiconductor process prediction model 150 in this embodiment, the prediction will be made only when the wafer to be tested has no physical defect, so as to ensure the accuracy of the prediction result. The following describes the training method first, and then the execution method.

Figure 3:
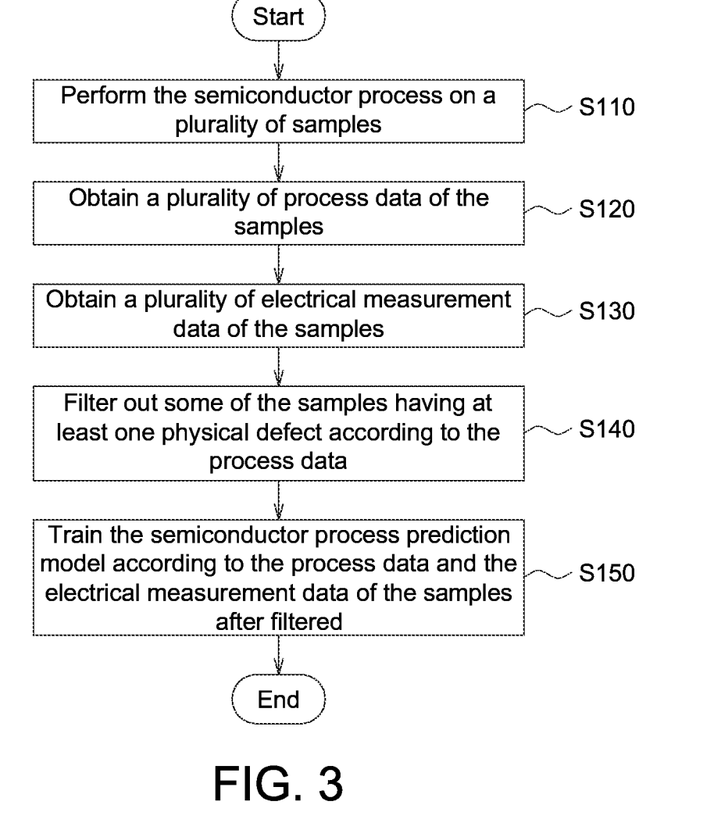
FIG. 3 shows a flowchart of the training method of the semiconductor process prediction model according to an embodiment.
Figure 4:
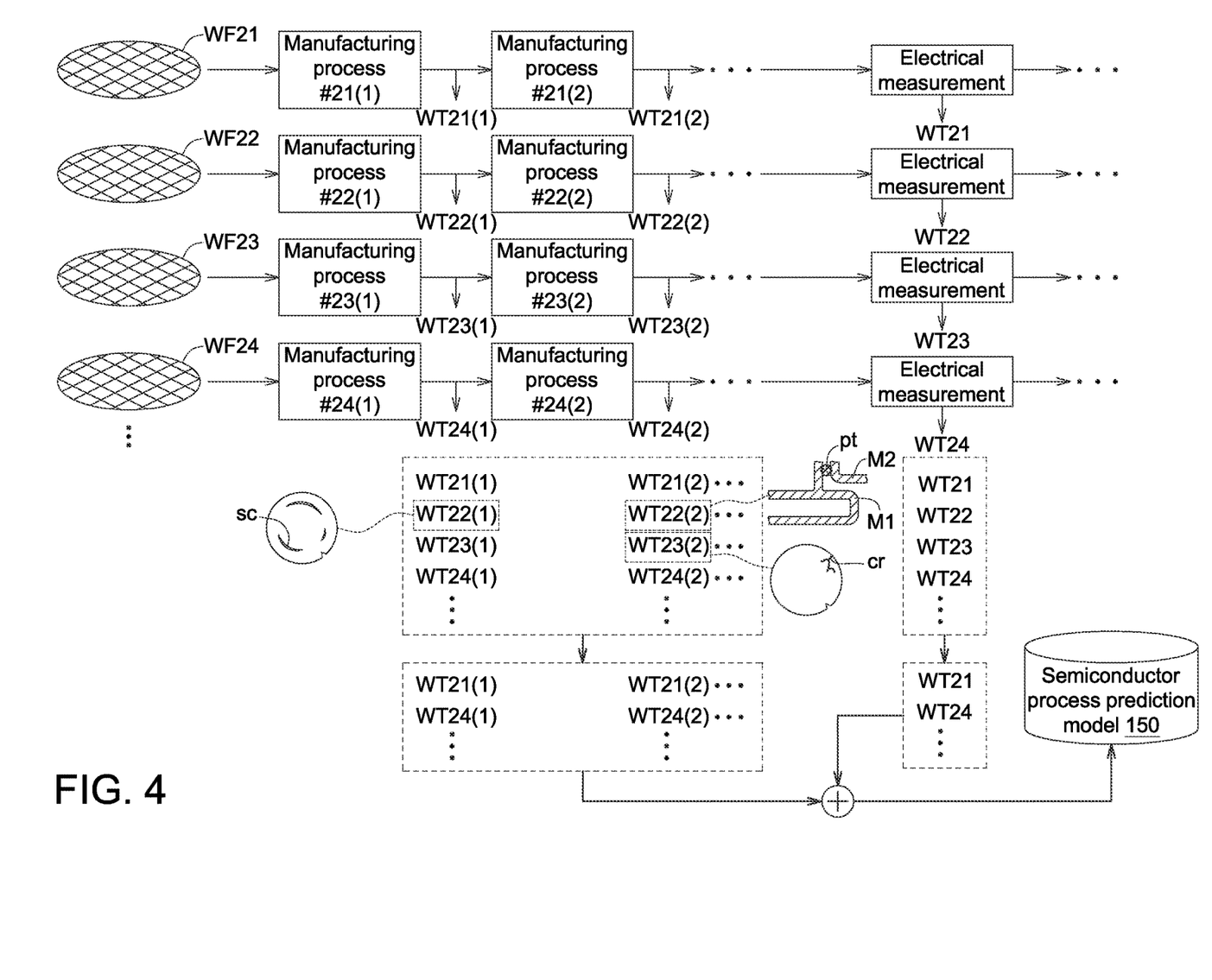
FIG. 4 shows an example of performing the steps in FIG. 3.

Please refer to FIGS. 2 to 4. FIG. 3 shows a flowchart of the training method of the semiconductor process prediction model 150 according to an embodiment. FIG. 4 shows an example of performing the steps in FIG. 3. In step S110, as shown in FIG. 4, the semiconductor process is performed on a plurality of samples WF21, WF22, WF23, WF24, etc. The semiconductor process is, for example, etching, deposition, annealing, ion implantation, etc. In one embodiment, the samples WF21, WF22, WF23, WF24, . . . may be the same lot belonging to the same product. Alternatively, the samples WF21, WF22, WF23, WF24, . . . can be different batches belonging to the same product. Or, the samples WF21, WF22, WF23, WF24, . . . can be different products manufactured by different process sequences and different process.

Then, in step S120, the process data receiving unit 120 obtains a plurality of process data MT21(1), MT21(2), . . . , MT22(1), MT22 (2), . . . , MT23(1), MT23(2), . . . , MT24(1), MT24(2), . . . of the samples WF21, WF22, WF23, WF24, etc. The process data MT21(1), MT21(2), . . . , MT22(1), MT22(2), . . . , MT23(1), MT23(2), . . . , MT24(1), MT24(2), . . . are, for example, physical measurement data. The physical measurement data is, for example, the measurement data (metrology data), such as width and thickness, detected by an optical microscope, an electron microscope or an ion microscope.

In another embodiment, the process data MT21(1), MT21 (2), . . . , MT22(1), MT22(2), . . . , MT23(1), MT23(2), . . . , MT24(1), MT24(2), . . . further include equipment setting data or equipment detecting data. The equipment setting data is, for example, the temperature set in the equipment, the pressure set in the equipment, the processing time set in the equipment, the gas used in the equipment, the gas flow set in the equipment, and so on. The equipment detecting data is, for example, the temperature detected by the equipment, the pressure detected by the equipment, the wavelength of light measured by the equipment, and so on.

Then, in step S130, as shown in FIG. 4, the electrical data receiving unit 130 obtains a plurality of electrical measurement data WT21, WT22, WT23, WT24, etc. of the samples WF21, WF22, WF23, WF24, etc. The electrical measurement data WT21, WT22, WT23, WT24, etc., such as Wafer Acceptance Test (WAT), which are used to test the electrical parameters of NMOS, PMOS, resistor, contact resistor or internal connection in the wafers WF21, WF22, WF23, WF24, etc.

Then, in step S140, as shown in FIG. 4, the filtering unit 130 filter out some of the samples WF21, WF22, WF23, WF24, . . . having at least one physical defect according to the process data MT21(1), MT21(2), . . . , MT22(1), MT22(2), . . . , MT23(1), MT23(2), . . . , MT24(1), MT24(2), etc. The physical defect is, for example, a particle pt, a scratch sc, or a crack cr, etc. which are detected by an optical microscope, an electron microscope or an ion microscope. For example, the process data MT22(2) is the particle pt. When the particle pt is located between two wires M1, M2, it will cause a short circuit. Therefore, the particles pt will have a significant impact on the electrical measurement data WT22. The process data MT22(1) is the scratch sc. The scratch sc may destroy the element structure. Therefore, the scratch sc will have a significant impact on the electrical measurement data WT22. The process data MT23(2) is the crack cr. The crack cr may damage the wiring or cause wafer breaking. Therefore, the crack cr also has a significant effect on the electrical measurement data WT23. The filtering unit 130 filters out the samples WF22, WF23 having physical defects according to the scratch sc, the particle pt, the crack cr in the process data MT22(1), MT22(2), MT23(2), and keeps the samples WF21, WF24, etc. That is to say, the process data MT22(1), MT22(2), . . . , MT23(1), MT23(2), . . . and the electrical measurement data WT22, WT23 of the samples WF22, WF23 are filtered out.

Then, in step S150, as shown in FIG. 4, the semiconductor process prediction model 150 is trained according to the process data MT21(1), MT21(2), . . . , MT24(1), MT24(2), etc. and the electrical measurement data WT21, WT24, etc. of the samples WF21, WF24, etc. after filtered. During training, the samples WF22, WF23 having physical defects are not considered. The physical defects are accidental events, not normal events in the process. Therefore, after filtering out the samples WF22, WF23 having physical defects, the prediction results of the semiconductor process prediction model 150 will not be biased by the accidental events.

Figure 5:
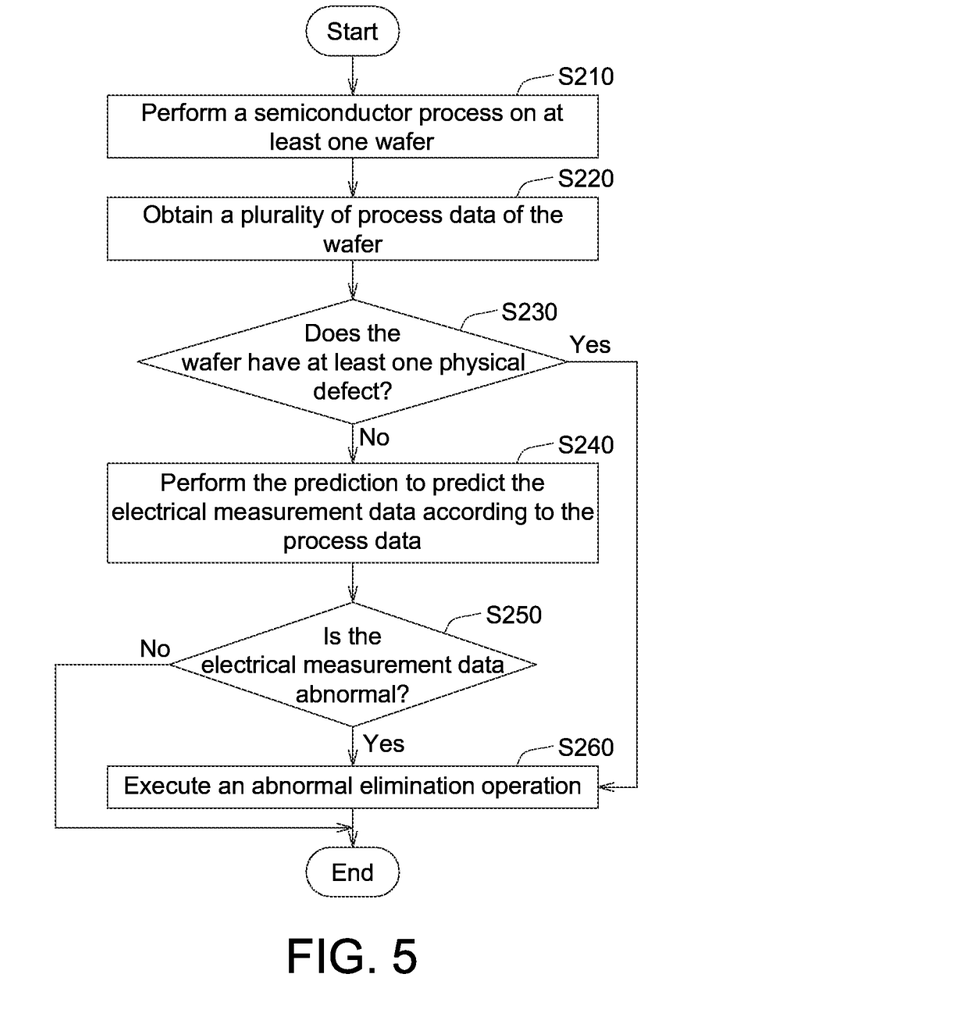
FIG. 5 is a flowchart illustrating a prediction method of a semiconductor process according to an embodiment.
Figure 6:
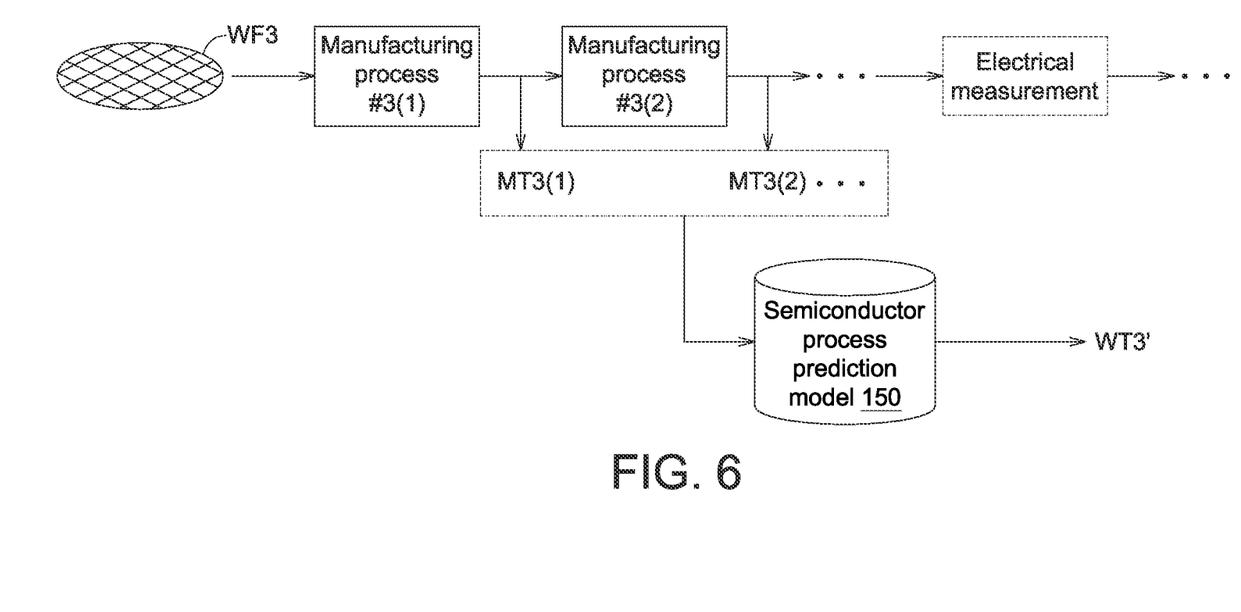
FIG. 6 shows an example of the steps in FIG. 5.

Please refer to FIGS. 5 to 6. FIG. 5 is a flowchart illustrating a prediction method of a semiconductor process according to an embodiment. FIG. 6 shows an example of the steps in FIG. 5. In step S210, as shown in FIG. 6, a semiconductor process is performed on at least one wafer WF3. The semiconductor processes is, for example, etching, deposition, annealing, or ion implantation etc. In one embodiment, the wafer WF3 may be performed the process which is the same as the process performed on the training samples of the semiconductor process prediction model 150. Alternatively, the wafer WF3 can be performed the process which is fine-tuned from the process performed on the training samples of the semiconductor process prediction model 150. Or, the wafer WF3 can be performed the process which is different from the process performed on the training samples of the semiconductor process prediction model 150.

Then, in step S220, as shown in FIG. 6, the process data receiving unit 120 obtains a plurality of process data MT3(1), MT3(2), etc. of the wafer WF3. The process data MT3(1), MT3(2), etc. are, for example, physical measurement data. The physical measurement data is, for example, the measurement data (metrology data), such as width and thickness, detected by an optical microscope, an electron microscope or an ion microscope.

In another embodiment, the process data MT3(1), MT3(2), etc. may further include an equipment setting data or an equipment detecting data. The equipment setting data is, for example, the temperature set in the equipment, the pressure set in the equipment, the processing time set in the equipment, the gas used in the equipment, the gas flow set in the equipment, and so on. The equipment detecting data is, for example, the temperature detected by the equipment, the pressure detected by the equipment, the wavelength of light measured by the equipment, and so on.

Then, in step S230, as shown in FIG. 6, the determination unit 230 determines whether the wafer WF3 has at least one physical defect according to the process data MT3(1), MT3(2), etc. The physical defects are, for example, the particle pt (shown in FIG. 4), the scratch sc (shown in FIG. 4), or the crack cr (shown in FIG. 4) detected by the optical microscope, the electron microscope or the ion microscope. As shown in FIG. 6, the wafer WF3 has no physical defect, so the process proceeds to the step S240.

In step S240, the semiconductor process prediction model 150 performs the prediction to predict the electrical measurement data WT3' according to the process data MT3(1), MT3(2), etc. The training process of the semiconductor process prediction model 150 does not consider the samples having physical defects. The physical defects are accidental events, not normal events in the process. Therefore, after filtering out the samples having physical defects, the predictions of the semiconductor process prediction model 150 will not be biased by the accidental events. Therefore, the semiconductor process prediction model 150 can accurately predict the electrical measurement data WT3' in this step.

Then, in step S250, whether the electrical measurement data WT3' is abnormal is determined. If the electrical measurement data WT3' is abnormal, then the process proceeds to the step S260.

In step S260, an abnormal elimination operation is executed. The abnormal elimination operation is, for example, the machine inspection, the machine parameter adjustment or the recipe adjustment to avoid the occurrence of a large number of defective products.

Through the above prediction method, the wafer WF3 without physical defects can be accurately predicted the electrical measurement data WT3', so that when the electrical measurement data WT3' is abnormal, the machine detection, the machine parameter adjustment or the process recipe adjustment can be executed to avoid the occurrence of a large number of defective products.

Figure 7:
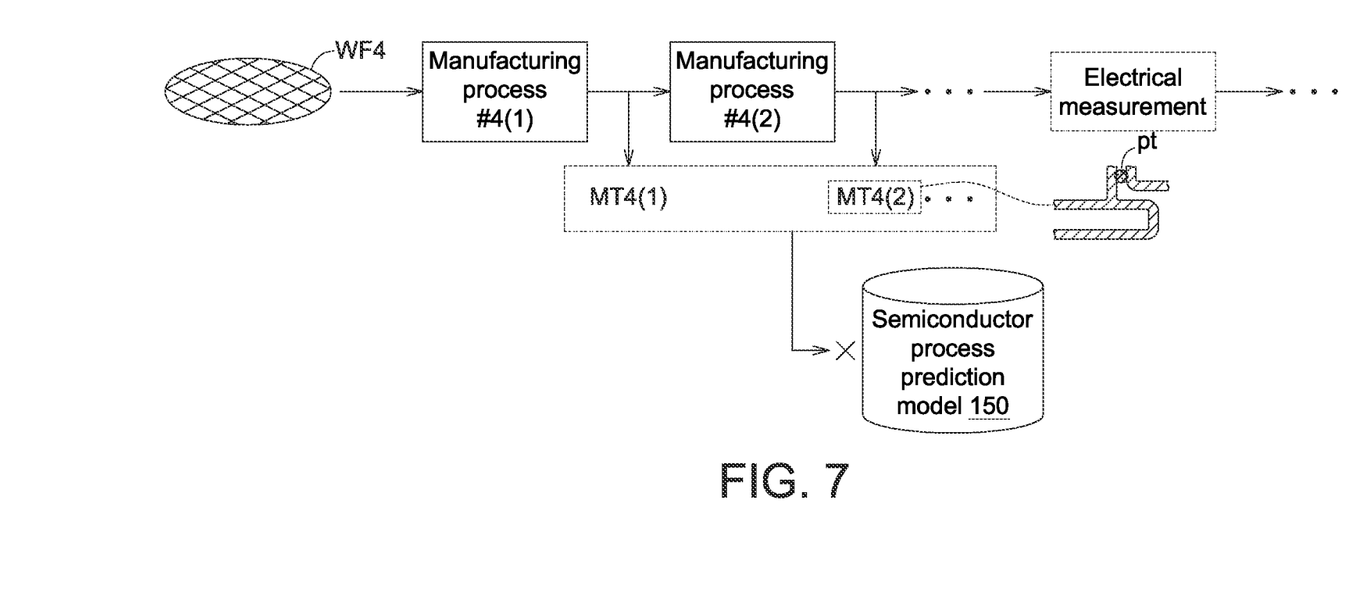
FIG. 7 illustrates another example of the steps in FIG. 5.

Please refer to FIG. 5 and FIG. 7. FIG. 7 illustrates another example of the steps in FIG. 5. In step S210, as shown in FIG. 7, a semiconductor process is performed on at least one wafer WF4. The semiconductor process is, for example, etching, deposition, annealing, ion implantation, etc. In one embodiment, the wafer WF4 may be performed the process which is the same as the process performed on the training samples of the semiconductor process prediction model 150. Alternatively, the wafer WF4 can be performed the process which is fine-tuned from the process performed on the training samples of the semiconductor process prediction model 150. Or, the wafer WF4 can be performed the process which is different from the process performed on the training samples of the semiconductor process prediction model 150.

Then, in step S220, as shown in FIG. 7, the process data receiving unit 120 obtains a plurality of process data MT4(1), MT4(2), etc. of the wafer WF4. The process data MT4(1), MT4(2), etc. are, for example, physical measurement data. The physical measurement data is, for example, the measurement data (metrology data), such as width and thickness detected by an optical microscope, an electron microscope or an ion microscope.

In another embodiment, the process data MT4(1), MT4(2), eta. may further include the equipment setting data or the equipment detecting data. The equipment setting data is, for example, the temperature set in the equipment, the pressure set in the equipment, the processing time set in the equipment, the gas used in the equipment, the gas flow set in the equipment, and so on. The equipment detecting data is, for example, the temperature detected by the equipment, the pressure detected by the equipment, the wavelength of light measured by the equipment, and so on.

Then, in step S230, as shown in FIG. 7, the determination unit 230 determines whether the wafer WF4 has at least one physical defect according to the process data MT4(1), MT4(2), etc. The physical defect is, for example, the particle pt (shown in FIG. 4), the scratch sc (shown in FIG. 4), the crack cr (shown in FIG. 4) detected by the optical microscope, the electron microscope or the ion microscope. As shown in FIG. 7, the wafer WF4 has the physical defect, i.e., the particles pt, so the process proceeds to step S260.

In step S260, an abnormal elimination operation is executed. The abnormal elimination operation is, for example, the fixture adjustment or the carrier adjustment, to avoid the occurrence of a large number of defective products.

Through the above prediction method, the wafer WF4 with physical defects can also be found abnormal, and the fixture adjustment and the vehicle adjustment can be executed immediately to avoid the occurrence of a large number of defective products.

Through the above embodiment, in the training process of the semiconductor process prediction model 150, the samples having physical defects are not considered. The physical defects are accidental events, not normal events in the process. Therefore, after filtering out the samples having physical defects, the prediction of the semiconductor process prediction model 150 will not be biased by the accidental events.

After improving the accuracy of the semiconductor process prediction model 150, the electrical measurement data can be accurately predicted for the wafers without physical defects, and the wafers with physical defects can also be found to be abnormal, which is very helpful to improve the yield.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A training method for a semiconductor process prediction model, comprising:
   performing a semiconductor process on a plurality of first samples with physical defects and a plurality of second samples without the physical defects;
   obtaining a plurality of process data of the first samples with the physical defects and the second samples without the physical defects;
   obtaining a plurality of electrical measurement data of the first samples with the physical defects and the second samples without the physical defects;
   filtering out the first samples with the physical defects to leave the second samples without the physical defects; and
   training the semiconductor process prediction model, wherein only the process data and the electrical measurement data of the second samples without the physical defects are used to train the semiconductor process prediction model, and the process data and the electrical measurement data of the first samples with the physical defects are not used to train the semiconductor process prediction model.

2. The training method of the semiconductor process prediction model according to claim 1, wherein the physical defects include particle, scratch and crack.

3. The training method of the semiconductor process prediction model according to claim 1, wherein the process data includes at least one physical measurement data.

4. The training method of the semiconductor process prediction model according to claim 1, wherein the process data includes at least one equipment setting data and at least one equipment detecting data.

5. The training method of the semiconductor process prediction model according to claim 1, wherein some of the process data and some of the electrical measurement data are filtered out.

6. A semiconductor process prediction device, comprises:
   a process data receiving unit, configured to obtain a plurality of process data of a processing wafer on which a semiconductor process is performed;
   a determination unit, configured to determine whether the processing wafer has at least one physical defect according to the process data, wherein if the processing wafer has the at least one physical defect, the processing wafer is a first wafer with the physical defect; if the processing wafer does not have the at least one physical defect, the processing wafer is a second wafer without the physical defect; and
   a semiconductor process prediction model, configured to perform a prediction to predict an electrical measurement data of the second wafer without the physical defect only, wherein the semiconductor process prediction model does not perform the prediction to predict the electrical measurement data of the first wafer with the physical defect.

7. The semiconductor process prediction device according to claim 6, wherein the physical defect is particle, scratch or crack.

8. The semiconductor process prediction device according to claim 6, wherein the process data includes at least one physical measurement data.

9. The semiconductor process prediction device according to claim 6, wherein the process data includes at least one equipment setting data and at least one equipment detecting data.

10. A prediction method of a semiconductor process, comprising:
    performing a semiconductor process on at least one processing wafer;
    obtaining a plurality of process data of the processing wafer;
    determining whether the processing wafer has at least one physical defect according to the process data, wherein if the processing wafer has the at least one physical defect, the processing wafer is a first wafer with the physical defect; if the processing wafer does not have the at least one physical defect, the processing wafer is a second wafer without the physical defect;
    terminating a prediction, if the processing wafer is the first wafer with the physical defect; and
    performing, via a semiconductor process prediction model, the prediction on the second wafer without the physical defect only to predict an electrical measurement data, wherein the prediction is not performed on the first wafer with the physical defect.

11. The prediction method of the semiconductor process according to claim 10, wherein the physical defect is particle, scratch or crack.

12. The prediction method of the semiconductor process according to claim 10, wherein the process data includes at least one physical measurement data.

13. The prediction method of the semiconductor process according to claim 10, wherein the process data includes at least one equipment setting data and at least one equipment detecting data.

* * * * *